TRANSISTOR FLIP-FLOP CIRCUIT ARRANGEMENTS

Filed Aug. 16, 1966 4 Sheets-Sheet 1

March 31, 1970 A. RICHARDSON 3,504,201

TRANSISTOR FLIP-FLOP CIRCUIT ARRANGEMENTS

Filed Aug. 16, 1966 4 Sheets-Sheet 2

United States Patent Office 3,504,201

Patented Mar. 31, 1970

3,504,201

TRANSISTOR FLIP-FLOP CIRCUIT ARRANGEMENTS

Allan Richardson, Overstone, Northampton, England, assignor to The Plessey Company, Limited, Ilford, England, a British company Filed Aug. 16, 1966, Ser. No. 572,795
Claims priority, application Great Britain, Aug. 18, 1965, 35,390/65
Int. Cl. H03k 3/26
U.S. Cl. 307—292 4 Claims

ABSTRACT OF THE DISCLOSURE

A transistor flip-flop circuit arrangement defining a binary counter comprising a pair of transistors connected as a principal bistable element and a second pair of transistors connected as detector and subsidiary bistable memory elements, said second pair of transistors acting to detect the state of said principal bistable element by differential emitter potential and said second pair having their collector electrodes cross-coupled to opposite bases to achieve a subsidiary bistable memory function so that the transistors of the second pair are conditioned in response to the state of the transistors of the principal element.

This invention relates to transistor circuit arrangements and relates more specifically to transistor circuits especially suitable for use as electronic counters or shift registers, for example.

In an electronic counter or shift register employing a transistor bi-stable circuit it is essential that means should be provided for detecting the state of the bi-stable circuit and for acting on such information to effect a change of state of the bi-stable circuit whilst remembering its state prior to such change.

The memory facility in a well-known basic binary counter is afforded by capacitor-resistor combinations, or less frequently by inductor-resistor combinations, connected in cross coupling paths between respective collectors and bases of the transistors of the bi-stable circuit to furnish the requisite time constant. However, the operating speed of such counters is seriously restricted by the time required to charge and discharge the reactive components of the memory arrangements whilst additional timing circuitry may be necessary in view of the limited time for which the reactive components are effective as a "memory." Moreover, the provision of such reactive components in integrated circuits which are finding increasingly wide application in the electronics field for achieving circuit miniaturisation, poses serious manufacturing and economic difficulties.

According to another known form of counter commonly referred to as the "double rank counter" the "memory" facility is provided by a bi-stable circuit and associated gates which co-operate with a further bi-stable circuit to define a binary counter. This counter, although it affords high speed operation and readily lends itself to integrated circuit techniques, is relatively complex and expensive to manufacture and in addition it has unduly high power consumption by reason of its relatively large number of circuit components.

The present invention seeks to alleviate the difficulties and disadvantages encountered with these known circuit arrangements by providing a bi-stable circuit arrangement which affords memory facilities making it suitable as a counter or shift register, for example, and which is eminently suitable for use in micro-miniature integrated circuits by the avoidance of reactive components whilst enabling a significant reduction to be made in the number of components.

According to the present invention as broadly conceived there is provided a transistor bi-stable circuit arrangement comprising a pair of transistors having connected to it a detector-memory arrangement conditioned in accordance with the state of the bi-stable circuit and having solid state switching devices which switch appropriately to such conditioning upon the application of a pulse to said detector-memory arrangement which accordingly applies an operating pulse to the bi-stable circuit to produce a change of state thereof and maintains such switched condition for memorising the former state of said bi-stable circuit.

According to one preferred arrangement of the invention the collector of each of the transistors of the bi-stable circuit is coupled to the base of the other transistor of the circuit through resistive means (e.g. resistor(s) or rectifier(s)) the detector-memory arrangement comprising two transistors having their emitters connected respectively to the collector base couplings between the bi-stable transistors and having themselves cross-coupled collector bases so that the transistors of the detector-memory arrangement are conditioned in dependence upon the state of the bi-stable transistors and upon the application of a pulse in common to the collector circuits of the conditioned transistors the pulse causes switching of one of the detector-memory transistors thereby steering the pulse to the non-conducting transistor of the bi-stable circuit to render it conducting and thus change the state of the bi-stable circuit. The switched detector-memory transistor remains conducting so as to memorise the original state of the bi-stable circuit detected prior to the change of state.

As well as being eminently applicable to binary counters and shift registers it is envisaged that the invention may be used for pulse sequence determination purposes as may be especially useful in radar, computers, telephone systems or other pulse sequence utilisation apparatus. For example, in the arrangement described above in which the same pair of transistors are used for detection and memory purposes the collector circuits of these two transistors may be separate and arranged to receive respective pulses the sequence of which is to be determined. As previously mentioned, the detector transistors will be conditioned in accordance with the state of the bi-stable circuit. Consequently, the state of the bi-stable circuit will be changed or remain unchanged according to the sequence of pulses applied to the collectors of the detector memory transistors. Reset means may be provided for re-setting the bi-stable circuit once it has changed its state in response to a particular input pulse sequence.

By way of example the invention will now be described with reference to the accompanying drawings in which.

Figure 1:
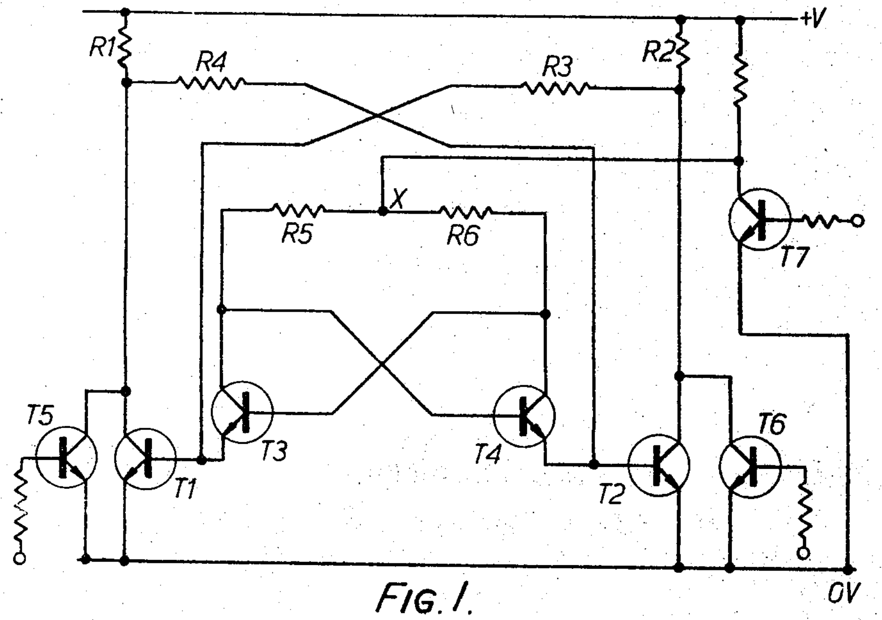
FIGURE 1 is a circuit diagram of one form of binary counter circuit according to the invention.

Referring firstly to FIGURE 1 of the drawing this shows a binary counter which includes a transistor bi-stable circuit comprising a pair of transistors T1 and T2 having collector resistors R1 and R2 and the bases of transistors T1 and T2 being cross-coupled with the collectors of transistors T2 and T1 through resistors R3 and R4, respectively. Transistors T5 and T6 are connected across the transistors T1 and T2 for setting and re-setting of the bi-stable circuit.

The binary counter needs to include means for detecting the instantaneous state of the bi-stable circuit, that is to say whether T1 is conducting and T2 non-conducting, or vice versa. It is also required to steer an input pulse for stepping the counter to that transistor of the bi-stable pair that is non-conducting as detected by the detecting means in order to effect a change of state of the bi-stable. Additionally, the state of the bi-stable detected prior to its change of state must be memorised. For these purposes the binary counter of FIGURE 1 includes, according to the invention, a composite detector-triggering-memory transistor arrangement comprising transistors T3 and T4 having the bases and collectors thereof directly cross-coupled and having their emitters connected to the cross-coupled base collector circuits of the bi-stable transistors T1 and T2. The collector circuits of the transistors T3 and T4 include resistors R5 and R6 respectively, and are connected in common to the collector of an input transistor T7.

For the purposes of describing the operation of the counter let is be assumed that the bi-stable circuit is in the state with the transistor T1 conducting and the transistor T2 non-conducting. The input transistor T7 is also conducting so that the point X is at the collector-emitter saturation voltage of the transistor T7.

Since the transistor T1 is conducting the emitter of transistor T3 will be at a voltage equal to that dropped across the base-emitter diode of the transistor T1. The emitter of the transistor T4, however, will be at the collector-emitter voltage of the transistor T1 which is lower than the base-emitter diode voltage of transistor T1. Thus the transistors T3 and T4 are conditioned in accordance with the state of the transistors T1 and T2 of the bi-stable, thereby performing the detector function. Consequently, if a counter stepping pulse is applied to the base of transistor T7 to render the transistor non-conducting the potential at the point X rises positively so that current passes through transistor T4 before transistor T3 by reason of the higher collector-emitter voltage T4. Accordingly, the transistor T4 switches on first thereby preventing the transistor T3 from conducting, by starving it of base current. The transistor T4 in switching on applies base current to the non-conducting transistor T2 in order to switch on this transistor whereupon the other transistor T1 of the bi-stable is rendered non-conducting. It will be appreciated therefore that the detector transistor arrangement acts in accordance with the state of the bi-stable detected to steer the incoming pulse to the appropriate transistor of the bi-stable and, moreover, the memory function of the arrangement is realised by arranging that one of the transistors T3 and T4 when it switches will remain in its switched condition so memorising the state of the bi-stable circuit before its last change of state.

Figure 2:
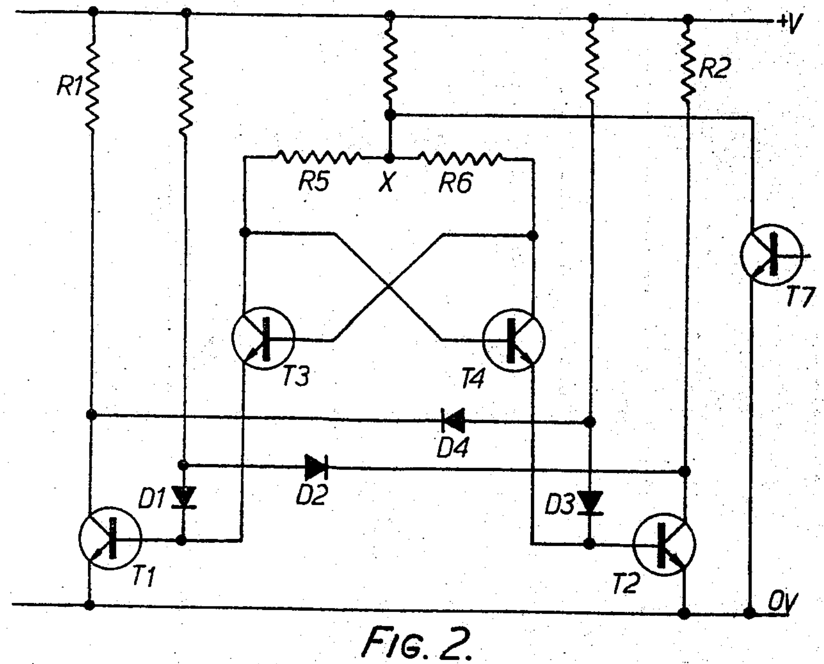
FIGURE 2 is a circuit diagram of a modification of the circuit shown in FIGURE 1.

It may here by mentioned that the detector-triggering-memory arrangement including the transistors T3 and T4 may also be used for bi-stable circuits employing different forms of cross couplings. For example the collector-base cross couplings may include diodes, in which case one of the emitters of the transistors T3 and T4 will not be held down to the collector-emitter saturation voltage. Such an arrangement is depicted in FIGURE 2 of the drawing with cmponents corresponding to those on FIGURE 1 bearing like designations. The diodes are shown at D1 to D4. As will be appreciated this arrangement necessitates that the base-emitter characteristics of the transistors shall be similar. In the case where diodes are used then the current path from the point X to the non-conducting transistor of the bi-stable pair T3 and T4 is still preferred. This is because although both paths from the point X consist of two base emitter diodes the path to the one side has one of these diodes already carrying current. This means that current will start to flow to the "off" side when the point X is at a lower voltage than is required for current to flow to the "on" side. Once current has started to flow to the "off" side the steering network locks in order to maintain the current flow in this direction and the pulse at the point X has been steered in the correct direction.

This circuit works in the following way. Let us assume that transistor T1 is conducting and T2 non-conducting and also assume that T7 is conducting then the point X will be at the collector/emitter saturation voltage above zero volts and the emitter of transistor T3 will be at a base/emitter voltage above zero volts. In this condition the emitter of transistor T4 is not directly held to any potential but will be of the order of zero volts. Assume now that transistor T7 is cut off, then the point X will start to rise in voltage and thus the bases of transistors T4 and T3 will rise in potential driven by R5 and R6. When point X reaches $V_{BE}$ above zero volts the emitter of T4 will also start to follow the rise of voltage but T4 will not yet switch on. Transistor T4 can only start conducting when its emitter voltage reaches the base/emitter turn-on voltage of transistor T2. Assuming matched base/emitter characteristics between transistors T1 and T2 the turn-on voltage of transistor T2 will be of the order of 100 millivolts less than the potential that is on the base of transistor T1 at present. As point X continues to rise, transistor T4 will thus start to conduct before transistor T3 and the current in R5 will be diverted to the base of transistor T2 tending to make T2 conducting and causing transistor T1 to become non-conducting. Before transistor T1 is fully switched off, T4 will be conducting fully and diverting the current through R6 to the base of transistor T2 thus removing any possibility of base current for T3 and thus the condition of T2 conducting and T1 non-conducting will be stable. Making transistor T7 conducting again and pulling point X close to zero volts will not alter the stability of the condition but on making T7 non-conducting again the procedure as described above will occur except that T3 and T1 will now become conducting.

It is also desirable, of course, that transistors T3 and T4 should have matched base/emitter characteristics.

Figure 3:
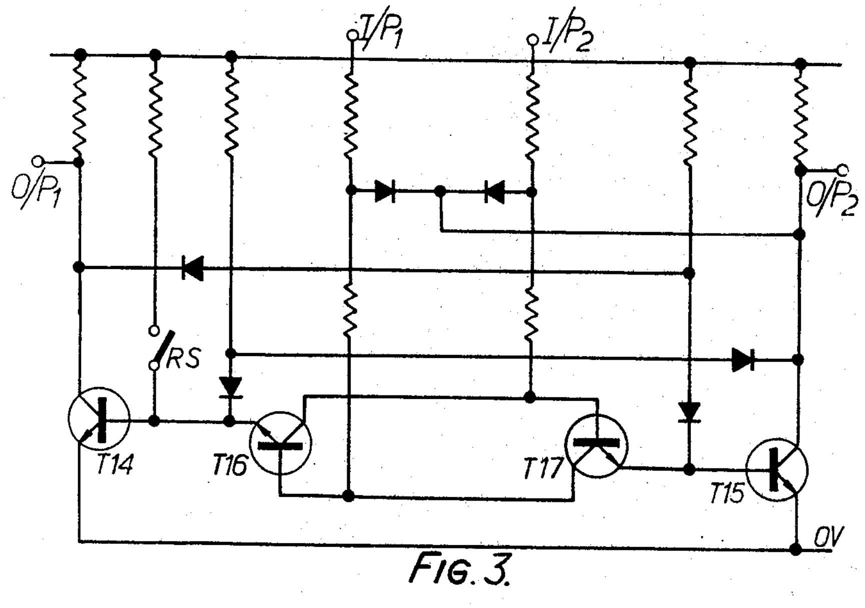
FIGURE 3 is a circuit diagram of a timing comparator for determining pulse sequence.

FIGURE 3 of the drawings shows a circuit arrangement suitable for determining the sequence of pulses. It consists of a bi-stable pair of transistors T14 and T15 a trigger arrangement which includes two transistors T16 and T17 cross-coupled as shown, having their emitters connected to the diode cross couplings between the two transistors T14 and T15 of the bi-stable pair, but having their base circuits electrically separate for receiving pulses at respective inputs I/P1 and I/P2. The cross-coupling arrangement between the bases and collectors of the transistors T14 and T15 including diodes as in the FIGURE 2 embodiment.

Considering the operation of the arrangement, let it be assumed that the bi-stable circuit is in the reset state with the transistor T14 conducting and transistor T15 non-conducting. A pulse applied to input I/P1 will switch on transistor T16 and drive transistor T14 on harder still. A subsequent pulse applied at I/P2 will be diverted via transistor T16 also to drive transistor T14 harder on. Thus if the pulse applied at I/P1 is before that applied to I/P2 the state of the bi-stable is unchanged. However, if the pulse applied at I/P2 is first it will switch on transistor T17 followed by transistor T15 thus changing the state of the bi-stable to transistor T14 non-conducting and T15 conducting. This state of the bi-stable is maintained irrespective of whether further pulses are applied to the inputs I/P1 and I/P2 until the bi-stable is reset by the operation of a reset switch RS. The reason for this is that with transistor T15 now conducting O/P2 is at a potential of almost zero volts and thus the points below the resistors on I/P1 and I/P2 which are connected to O/P2 via the diodes are held to a potential sufficiently low to hold transistors T16 and T17 permanently off. Thus any further input pulses applied to I/P1 and I/P2 will be diverted via the diodes to the collector of transistor T15 and thus to the zero volt line as T15 is conducing. If an I/P2 pulse is applied whilst an I/P1 pulse is on, the signal will be diverted to transistor T14 whilst if the I/P1 pulse turns off before an I/P2 pulse comes along the signal will be diverted to transistor T15. The sequency of pulses time displaced by as little as five nano seconds has been detected by the time comparator arrangement.

Figure 4:
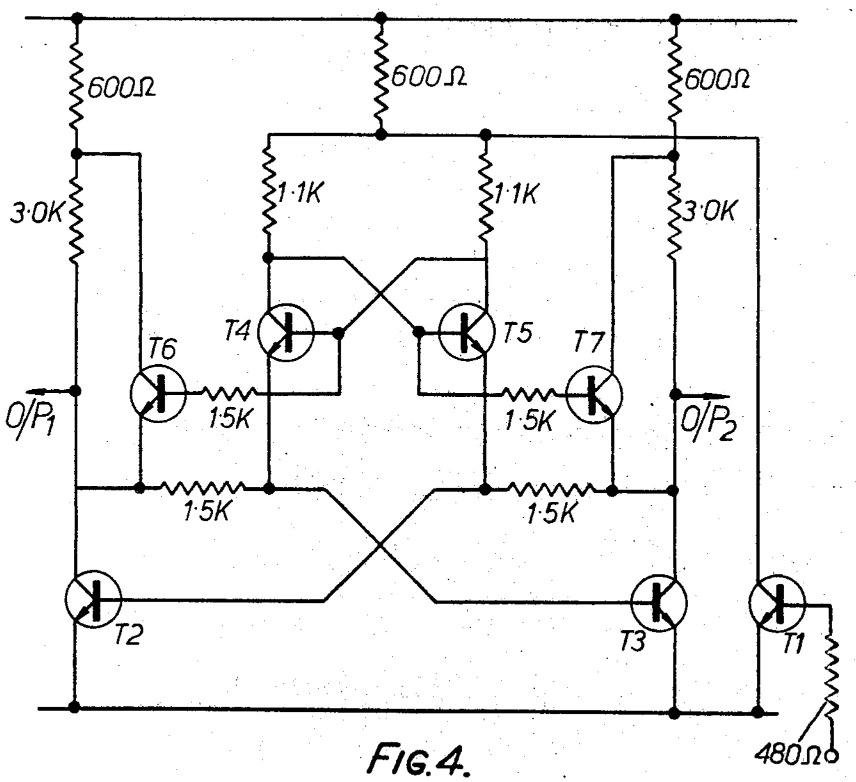
FIGURE 4 is a circuit diagram of a counter having an improved performance over the basic binary counter of the invention.

FIGURE 4 shows a circuit improvement over the basic binary counter which provides a better output waveform without significantly increasing the power consumption of the circuit. The improvement is concerned with the leading edge of the output waveform which is arranged to have a faster rise time via the two transistors T6 and T7. T6 improves the waveform at O/P1 and T7 improves that at O/P2. The operation of the basic binary counter is as already described. The operation of the new circuitry is as follows:

Suppose T2 is on and therefore T3 is off. The trigger steering and memory circuit is thus "primed" to energize with T4 on and T5 off. Now T4 will start to pass current when the potential at its base reaches the addition of the collector emitter saturation voltage of T2 and its own forward base-emitter voltage drop. There is a second current path from the base of T4 to the collector of T2 via the base-emitter of T6. Since this is made of identical impedance to that of the original path via T4, T6 will turn on at the same time as T4 and in doing so will effectively reduce the collector load resistance of T2. Now the current from the emitter of T4 will, in the normal manner, switch on T3 which will in turn switch off T2 by bi-stable action. The collector voltage of T2 will now rise at a rate determined by the capacity on the collector and the effective lower load resistance and will therefore be faster than if T6 was not operating. Thus the rise time of the output waveform will be improved over the standard circuit. Now the base of T4 will have stabilised at a voltage equal to two forward base-emitter diode drops, i.e. its own and that of T3 and so when the O/P1 rises above the base-emitter forward voltage drop T6 will turn off again and the collector load resistance will revert to its normal value. Thus T6 is only on during the rising transition of the output waveform. A similar argument applies to the operation of T7.

In the example of FIGURE 4, the collector load resistance is effectively reduced from 3.6K ohms down to 600 ohms by the action as described giving an output voltage rise time of the order of 5 times improved over the basic circuit. A conventional way of achieving this improvement would be to have a collector load resistance of 600 ohms permanently in circuit, which of course increases the total power consumption of the whole circuit by the order of 5 times. Since the new technique dynamically provides a 600 ohms collector load only when it is required to provide fast output waveform transistions the power consumption is increased by only 5–10% instead of five times. The improvement in output waveform also raises the maximum useful frequency limit of the counter.

Figure 5:
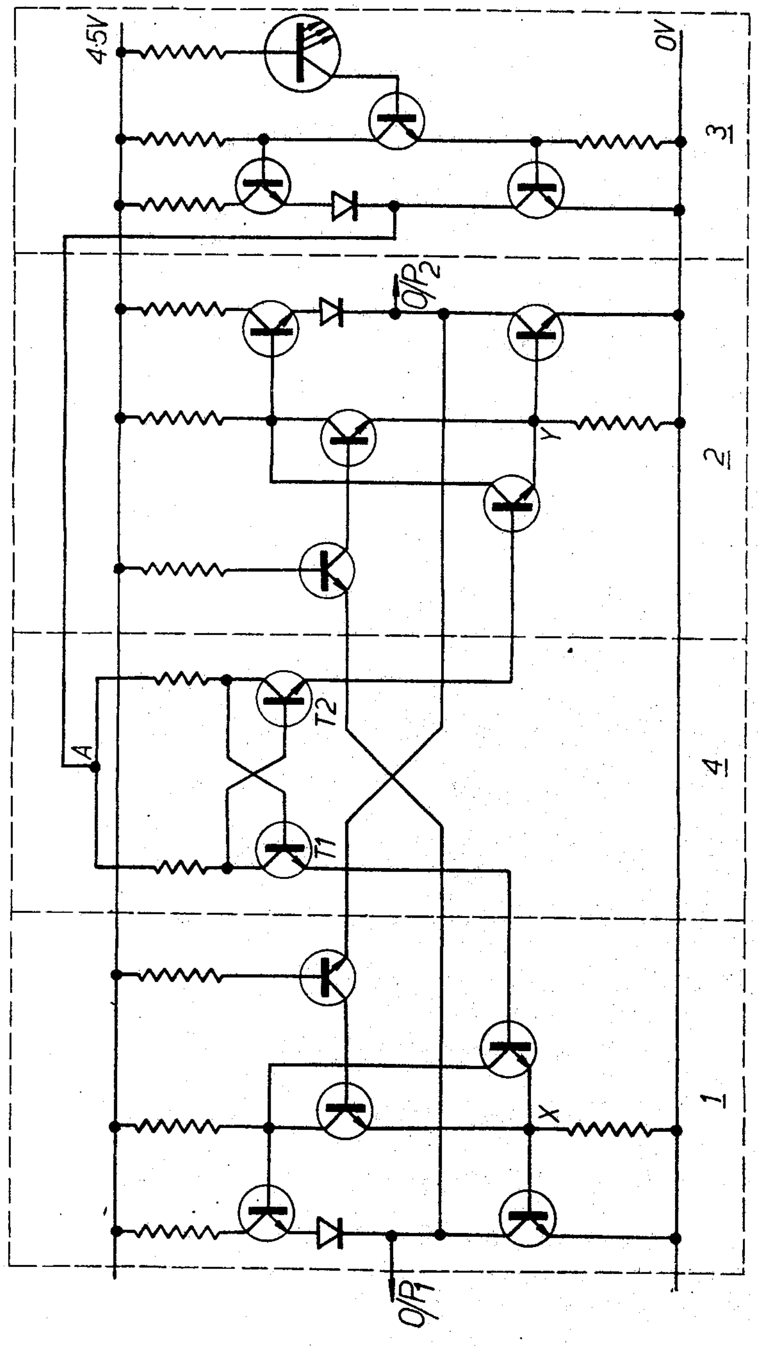
FIGURE 5 shows a circuit of the counter of the invention suitable for use in a different form of circuit logic.

FIGURE 5 shows the principle used in a "High Level TTL" type of counter and the items in the dotted line blocks indicate the basic features. Dotted line blocks 1 and 2 correspond to the transistors of the principal bi-stable element respectively and these are cross-coupled to form a bi-stable whilst dotted line block 3 constitutes an input gate to the counter. The trigger steering and memory circuit (dotted line block 4) is connected to the TTL bi-stable at points X and Y. Consider now that O/P1 is low and O/P2 is high then the potentials at the points X and Y will be respectively one forward emitter-base voltage drop above zero volt and zero volt.

The trigger-memory circuit is thus primed such that as point A, controlled by the input gate 3, rises transistor T2 turns on first and guides the trigger current to switch the bi-stable state. T2 thereafter holds off T1, whilst A remains high, and thus no further change of state occurs until point A is made to fall and then rise again via gate 3. This time the trigger current is steered via T1, to switch the bi-stable back to its original state. Thus each time a negative going transition is applied to an input of gate 3, allowing point A to rise, the bi-stable will change state and the circuit as a whole will count by 2.

Clearly the principle could also be used in designing counters in other basic logic families such as DTL and ECL.

From the foregoing the simplicity of counter arrangements according to the invention will be appreciated and also the absence of reactive components. Although the invention has been described with reference to simple binary counters having "set" and "reset" facilities it should be realised that the invention is also applicable to so-called J–K flip-flop circuits, "D" elements (shift registers) and counting circuits having more than two states of a binary counter.

What I claim is:

1. A transistor flip-flop circuit arrangement comprising a pair of transistors connected as a principal bi-stable element and a second pair of transistors connected as detector and subsidiary bistable memory elements said second pair of transistors acting to detect the state of said principal bistable element by differential emitter potentials and said second pair having their collector electrodes cross-coupled to their opposite bases and having their emitter electrodes connected respectively to the collector-base couplings of the transistors of the principal element to achieve a subsidiary bistable memory function so that the transistors of the second pair are conditioned in response to the state of the transistors of the principal element.

2. An arrangement as claimed in claim 1 in which collector electrodes of both the transistors of the principal bistable element are coupled to the base electrodes of the opposite transistors of said element through resistive means.

3. An arrangement as claimed in claim 2 in which the resistive means comprises rectifiers.

4. An arrangement as claimed in claim 2 in which the collector electrodes of the transistors of the second pair are electrically separated and are connected respectively to pulse input terminals to which respective pulses may be applied to enable the sequence of said pulses to be determined.

References Cited

UNITED STATES PATENTS

| | | | |
|---|---|---|---|
| 3,047,737 | 7/1962 | Kolodin | 307—292 X |
| 3,061,336 | 12/1962 | Eachus | 307—292 X |
| 3,238,387 | 3/1966 | Hill | 307—292 |
| 3,384,766 | 5/1968 | Kardash | 307—292 |

DONALD D. FORRER, Primary Examiner

JAMES D. FREW, Assistant Examiner

U.S. Cl. X.R.

307—232, 247, 291